United States Patent
Danielsons et al.

(10) Patent No.: US 6,600,516 B1
(45) Date of Patent: Jul. 29, 2003

(54) DIGITAL RF TRANSMITTER SYSTEM EMPLOYING BOTH DIGITAL PRE-CORRECTION AND ANALOG PRE-CORRECTION

(75) Inventors: David Christopher Danielsons, Maineville, OH (US); Paul Henry Mizwicki, Maineville, OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/556,718

(22) Filed: Apr. 21, 2000

(51) Int. Cl.[7] .................................................. H04N 5/21
(52) U.S. Cl. .......................... 348/608; 455/91; 455/119; 455/108; 455/127; 348/722; 348/723; 348/724; 375/296
(58) Field of Search ........................... 455/91, 115, 116, 455/114, 119, 127, 108; 348/722, 723, 724, 608; 341/126, 144; 375/296, 297

(56) References Cited

U.S. PATENT DOCUMENTS 6,281,936 B1 * 8/2001 Twitchell et al. ........... 348/470
6,285,412 B1 * 9/2001 Twitchell ................... 348/608
6,317,167 B1 * 11/2001 McNeely ................... 348/724
6,320,463 B1 * 11/2001 Leva et al. ................. 330/149
6,335,767 B1 * 1/2002 Twitchell et al. ........... 348/608

* cited by examiner

Primary Examiner—William Trost
Assistant Examiner—Marcos Torres
(74) Attorney, Agent, or Firm—Tarolli, Sundheim, Covell & Tummino L.L.P.

(57) ABSTRACT

A digital radio frequency transmitter system having an input circuit for receiving digital signals to be amplified and transmitted. A digital-to-analog converter converts the digital signals into analog signals. A series circuit is provided including a radio frequency filter and a radio frequency amplifier located downstream from the converter and wherein the filter and the amplifier respectively introduce linear and non-linear distortions into the analog signals for transmission by the transmitter. A digital pre-correction circuit is located upstream from the digital-to-analog converter for pre-correcting the digital signals in a manner to compensate for at least some of the distortions. An analog pre-correction circuit is interposed between the digital-to-analog converter and the series circuit for pre-correcting the analog signals to additionally compensate for at least some of the distortions prior to application to the series circuit.

19 Claims, 3 Drawing Sheets

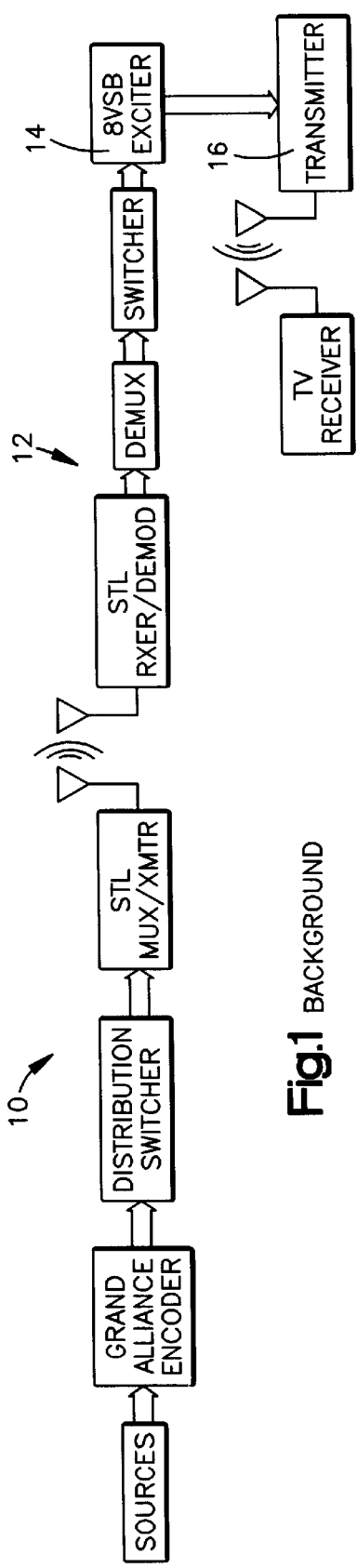
Fig.1 BACKGROUND
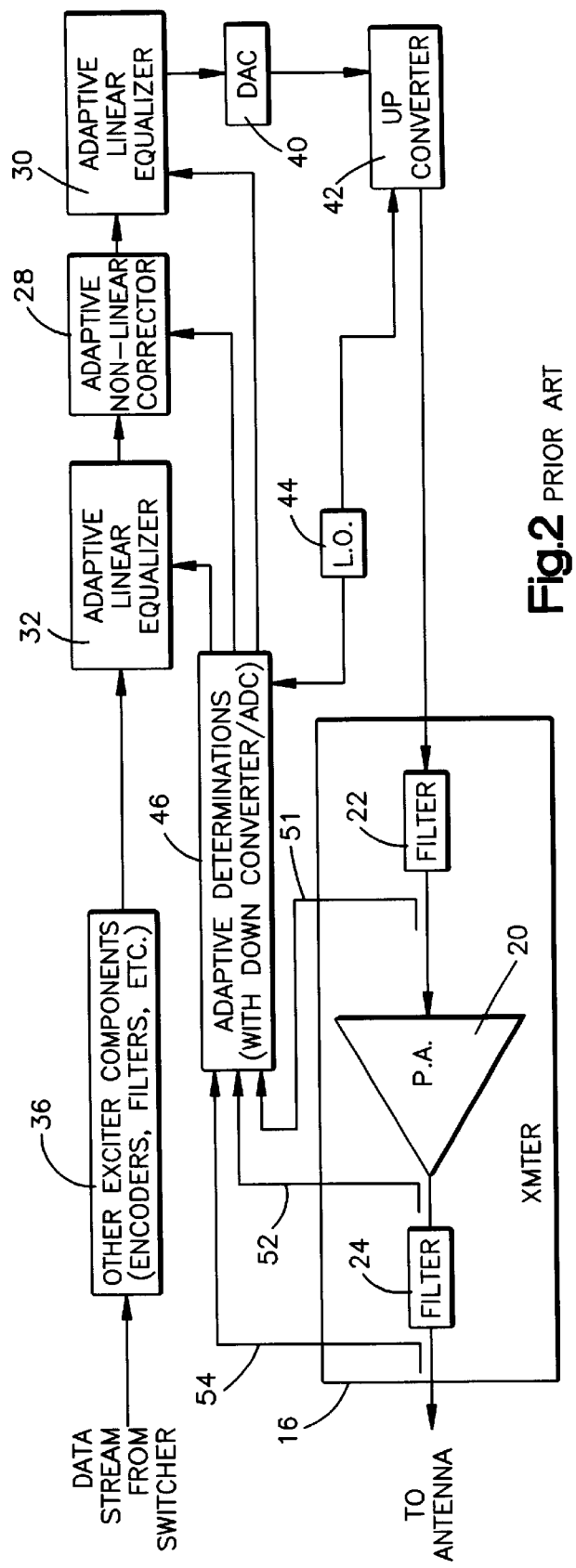
Fig.2 PRIOR ART

DIGITAL RF TRANSMITTER SYSTEM EMPLOYING BOTH DIGITAL PRE-CORRECTION AND ANALOG PRE-CORRECTION

TECHNICAL FIELD

The present invention is directed to the art of RF broadcast transmission systems and, more particularly, to improvements in providing pre-correction of a digital information signal prior to amplification and transmission.

BACKGROUND OF THE INVENTION

It is known that various communication systems require amplification of an information data stream. The data stream may be provided in a digital format and then converted to an analog signal which is then applied to a high power amplifier. Such an amplifier may distort the signal and corrections are needed.

With the recent introduction of high definition TV (HDTV) many TV broadcasters are required by the FCC (Federal Communications Commission) to transmit at relatively high power levels. To meet such high power levels with reasonable efficiency, most amplifiers are operated in Class A or Class A/B. Even with the high linearity of these amplifiers, the peak to average ratio for the digital systems and the power levels required, the amplifiers create spectral re-growth in adjacent channels due to the memory-full (linear) and non-memory-full (non-linear) distortions. A DIGITAL RF TRANSMITTER SYSTEM EMPLOYING BOTH DIGITAL PRE-CORRECTION AND ANALOG PRE-CORRECTION

TECHNICAL FIELD

The present invention is directed to the art of RF broadcast transmission systems and, more particularly, to improvements in providing pre-correction of a digital information signal prior to amplification and transmission.

BACKGROUND OF THE INVENTION

It is known that various communication systems require amplification of an information data stream. The data stream may be provided in a digital format and then converted to an analog signal which is then applied to a high power amplifier. Such an amplifier may distort the signal and corrections are needed.

With the recent introduction of high definition TV (HDTV) many TV broadcasters are required by the FCC (Federal Communications Commission) to transmit at relatively high power levels. To meet such high power levels with reasonable efficiency, most amplifiers are operated in Class A or Class A/B. Even with the high linearity of these amplifiers, the peak to average ratio for the digital systems and the power levels required, the amplifiers create spectral re-growth in adjacent channels due to the memory-full (linear) and non-memory-full (non-linear) distortions.

In addition to the higher power levels required by the broadcaster, the FCC has placed stringent emission requirements on the transmission equipment. In particular, the out-of-channel emission must be maintained at extremely low levels. In order to meet the required FCC mask for emission, a combination of pre-correction and high power filters are required on the output side of the transmitter. While these filters are effective at reducing the out-of-channel emissions, they introduce group delay to the desired transmitted channel. The group delay of the high power filter causes undesirable distortions to the transmitted signal and must be corrected.

To meet the required FCC emission mask for the digital television standard, pre-correction is used to reduce the amplifiers spectral re-growth. The output from the amplifier is then filtered with a high power filter to further reduce spectral re-growth. To remove the linear or memory-full distortions introduced by the high power filter, a pre-correction network is applied prior to the transmitter.

The transmitter amplifier can be modeled as a cascade of blocks consisting of linear and non-linear blocks. For a typical amplifier these consist of a high power amplifier input network which has a filter, the amplifying device itself, and the amplifier output network which has a high power output filter. The distortion correction circuits may be arranged in an inverse or reverse order in terms of pre-correction linear and non-linear distortion correcting circuits.

The prior art includes a co-pending U.S. patent application Ser. No. 09/312,354 filed on May 14, 1999 entitled BROADCAST TRANSMISSION SYSTEM WITH DISTRIBUTED CORRECTION and which was filed in the names of Edwin R. Twitchell and Robert J. Plonka and assigned to the same assignee as the present application. That prior art is represented herein by FIG. 2 to which reference is now made. As will be described in greater detail hereinafter, the prior art of FIG. 2 includes a power amplifier having an input filter and an output filter with the filters providing linear distortion to the information signal. The information signal is taken from a data stream of digital data that is supplied to adaptive pre-correctors located upstream from the power amplifier. These adaptive pre-correctors are represented by digital adaptive linear equalizers and an adaptive non-linear corrector located in the inverse order to that of the components introducing the distortion. Other circuits are known in the prior art wherein the pre-correction is accomplished with only analog pre-corrector circuits. The present invention is directed to improvements wherein both analog and digital pre-corrector circuits are employed.

SUMMARY OF THE INVENTION

In accordance with the present invention there is provided a digital radio frequency transmitter system having an input circuit for receiving digital signals to be amplified and transmitted. The digital signals are converted by a digital-to-analog converter into analog signals. At least one radio frequency filter and a radio frequency amplifier are located in a series circuit downstream from the digital-to-analog converter and wherein the filter and the amplifier respectively introduce linear and non-linear distortions into the analog signals for transmission by the transmitter. A digital pre-correction circuit is located upstream from the digital-to-analog converter for pre-correcting the digital signals in a manner to compensate for at least some of the distortions. An analog pre-correction circuit is interposed between the digital-to-analog converter and the series circuit for pre-correcting the analog signals to additionally compensate for at least some of the distortions prior to application to the series circuit.

BRIEF DESCRIPTION OF THE DRAWINGS

The foregoing and other features of the invention will become apparent to one skilled in the art to which the present invention relates upon consideration of the following description of the invention with reference to the accompanying drawings, wherein:

FIG. 1 is a block diagram of one application to which the present invention may be employed;

FIG. 2 is a block diagram illustration of a prior art system;

DESCRIPTION OF PREFERRED EMBODIMENTS

Figure 3:
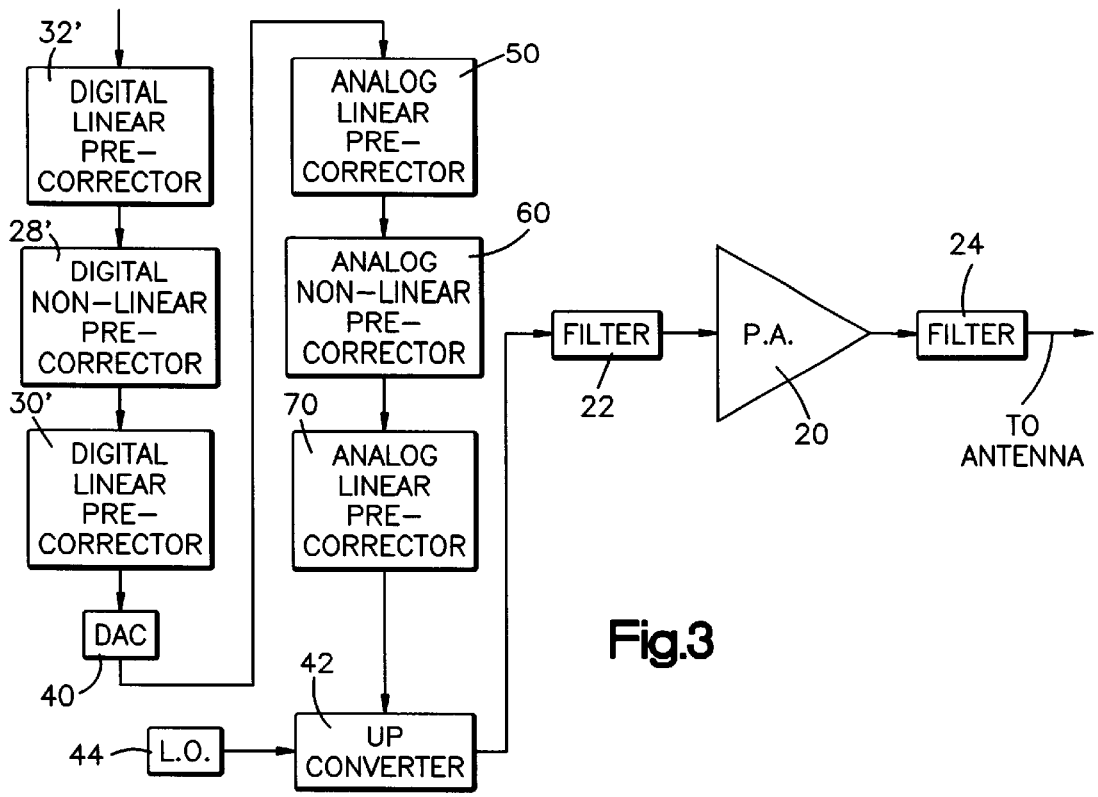
FIG. 3 is a block diagram illustration of one embodiment of the invention.

Before describing the preferred embodiments of the present invention, attention is first directed to FIGS. 1 and 2 which respectively provide background information and a depiction of the prior art. The present invention is intended for use in an RF broadcast system which may include high definition digital television sometimes referred to as HDTV or simply DTV. Such a system is illustrated in FIG. 1 and includes studio equipment 10 and transmitter equipment 12 with the link between the two taking the form of microwave link (other suitable forms such as cable and the like may be employed). The components employed at the transmitter include an 8VSB exciter 14 and a transmitter 16.

The transmitter 16 (FIG. 2) includes a power amplifier 20, a pre-amplification filter 22 located upstream of the amplifier and a post amplification filter 24 located downstream of the amplifier. The pre-amplification filter is sometimes referred to as an input filter and the post amplification filter is sometimes referred to as a high power output filter. It is to be appreciated that the transmitter 16 may include other components.

The power amplifier 20 amplifies the information signal to a power level that is suitable for broadcast transmission of an RF signal. In one example, the amplified power level may be on the order of 50 kilowatts. The power amplifier 20 may be comprised of an array of amplifying devices. Also the amplifier may include an inductive output tube (IOT).

A non-linear distortion (non-memory-full distortion) is imposed by the power amplifier 20 upon the information signal during amplification of the information signal. Specifically, the non-linear distortion is directed to changes in instantaneous amplitude and phase variations.

In addition, the filters 22 and 24 impose linear distortions (memory-full distortions) to the information signal. That is, the input filter 22 imposes a first linear distortion and the high power filter 24 imposes a second linear distortion to the information signal.

The prior art of FIG. 2 provides pre-correction for the distortions introduced by filters 22 and 24 and amplifier 20. Specifically, this prior art includes adaptive digital pre-correctors including an adaptive linear equalizer 32 that serves to pre-correct the information signal for the linear distortions that are introduced by the filter 24. An adaptive digital non-linear corrector 28 is located downstream from equalizer 32 and serves to pre-correct the information signal for the non-linear distortions introduced by the power amplifier 20. An adaptive digital linear equalizer 30 is located downstream from corrector 28 and serves to pre-correct the information signal for the linear distortions introduced by filter 22. It is to be noted that the linear equalizer 32, the non-linear corrector 28 and the linear equalizer 30 are arranged in a sequence such that the pre-corrections for the distortions are imposed on the information signal in a sequential order that is the inverse of the order that the distortions occur. The digital linear equalizer 32 may take the form of a FIR digital filter that has suitable structure for pre-correcting the information signal to compensate for the linear distortion caused by the high power filter. The equalizer 32 may take the form of a microprocessor that performs a programmed process and/or may be comprised of discrete "hard wired" circuitry. The adaptive digital linear equalizer 30 may be constructed in the same manner as equalizer 32. The non-linear corrector 28 also may take the form of a microprocessor that performs a programmed process and/or may be comprised of discrete "hard wired" circuitry.

The digital data located in the data stream from the switcher in FIG. 1 is supplied to the exciter 14 which includes other exciter components from FIG. 2, such as encoders, filters 36 and the like and the digital signal in this data stream is then supplied to the adaptive linear equalizer 32.

The pre-corrected digital information signal obtained from the equalizer 30 is then converted to an analog signal by means of a digital-to-analog converter 40 and up converted by an up-converter 42 driven by a local oscillator 44. The up-converted analog information signal is then supplied to filter 22.

The system as illustrated in FIG. 2 also includes an adaptive determinations function 46 that facilitates the selection of various sample points of the information signals so that the equalizer 32, the corrector 28, and the equalizer 30 can provide pre-correction. In order for the adaptation to operate, a first sample signal 51 is coupled off within the transmitter 16 subsequent to filtering by the input filter 22. A second sample signal 52 is coupled off within the transmitter 16 subsequent to the amplification by the power amplifier 20. A third sample signal 54 is coupled off within the transmitter subsequent to the filtering by the output filter 24.

It is to be noted that all of the pre-correction performed by the prior art circuit of FIG. 2 is accomplished with adaptive digital pre-correctors taking the form of the adaptive linear pre-correctors (or equalizers) 30 and 32 and the adaptive non-linear pre-corrector (or corrector) 28. In accordance with the present invention, both analog and digital pre-correction circuits are provided for pre-correcting the information signal to compensate for the distortions introduced by a power amplifier and accompanying filter networks. One of these circuits may serve as the fine tuning circuit and the other may take the form of a course tuning circuit. Thus, for example, the analog correction circuit may serve as a course correction circuit and while it provides correction, it may leave some errors that need remain to be corrected. The digital pre-correction circuit provides additional correction of the information signal. Alternatively, the fine tuning circuit may be the analog pre-correction circuit and the course tuning circuit may be the digital pre-correction circuit.

Reference is now made to the embodiment of the invention herein as illustrated in FIG. 3. This embodiment employs components which correspond with those illustrated in the prior art of FIG. 2 and such components are identified with like character references. These include the power amplifier 20, filters 22 and 24, the up-converter 42, the local oscillator 44 and a digital-to-analog converter 40. Upstream from the digital-to-analog converter 40 there is provided digital linear pre-correctors 30' and 32' corresponding to the adaptive digital linear equalizers 30' and 32' (but it should be noted that correctors 30' and 32' are not adaptive but could be). Interposed between pre-correctors 30' and 32' there is provided a non-adaptive digital non-linear pre-corrector 28' corresponding with the corrector 28 in FIG. 2. Thus the pre-correctors 28', 30' and 32' provide the digital pre-correction circuit herein.

Interposed between the digital-to-analog converter 40 and the up-converter 42 there is provided an analog pre-correction circuit. This analog circuit includes an analog linear pre-corrector 50, an analog non-linear pre-corrector 60 and an analog linear pre-corrector 70. These analog pre-correctors may take any suitable form of the prior art which serve to pre-correct the information signal to provide pre-correction of an analog signal flowing therethrough to compensate for at least some of the linear distortions (by pre-correctors 50 and 70) and some of the non-linear distortions with the pre-corrector 60.

Figure 4:
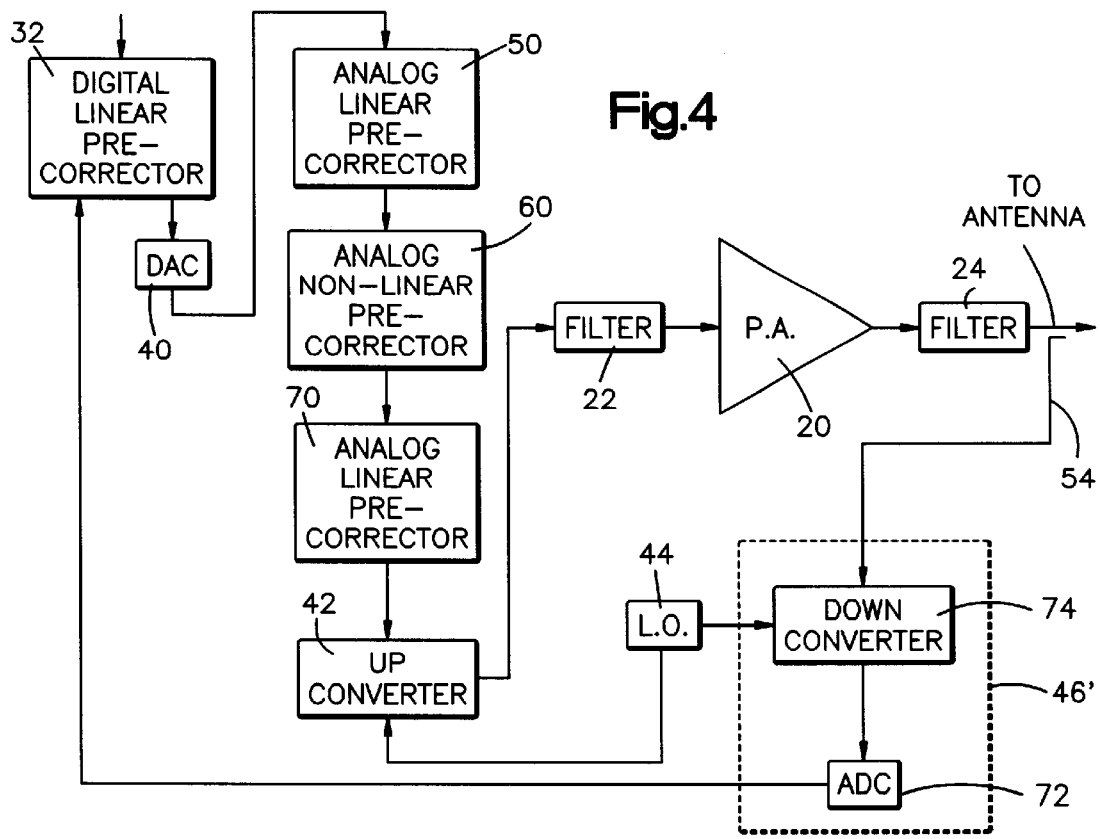
FIG. 4 is a block diagram illustration of a second embodiment of the present invention; and, FIG. 5 is a block diagram illustration of a still further embodiment of the present invention.

Reference is now made to FIG. 4 which shows a second embodiment of the invention. This embodiment is similar to that of the embodiment illustrated in FIG. 3 and accordingly like components are identified herein with like character references. Only the differences between the embodiment of FIG. 4 and that of FIG. 3 will be described in detail herein. It will be noted from FIG. 4 that the analog pre-correction circuit includes pre-correctors 50, 60 and 70 as in the case of the embodiment of FIG. 3. However, this embodiment includes a single adaptive digital linear pre-corrector 32 which receives a digital correction signal from an analog-to-digital converter 72. A sample signal 54 is coupled off the output of the filter 24 and is supplied to an adaptive determining circuit 46' and which includes a down-converter 74 along with the analog-to-digital converter 72.

Figure 5:
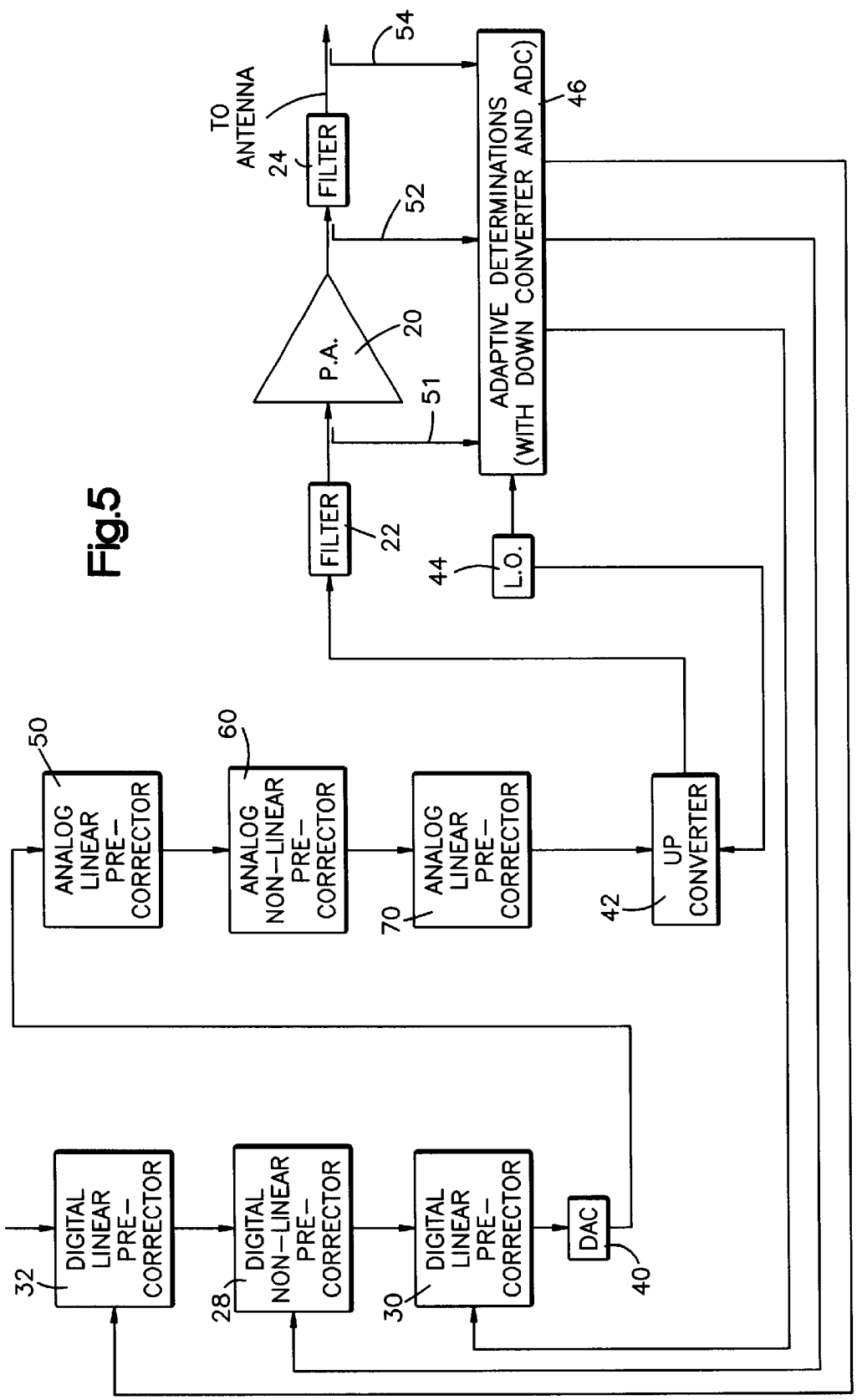

Reference is now made to FIG. 5 which illustrates a still further embodiment of the present invention. This embodiment incorporates components corresponding to those illustrated in FIGS. 3 and 4 and consequently like components are identified herein with like character references. It will be noted that the embodiment of FIG. 5 includes a digital pre-correction circuit including adaptive pre-correctors 28, 30 and 32 whereas the embodiment of FIG. 4 incorporates only a single adaptive pre-corrector 32 and that the pre-correctors in FIG. 3 are non-adaptive. Also, it is to be noted that the analog pre-correction circuit located downstream from the digital-to-analog converter includes pre-correctors 50, 60 and 70 as in the embodiment of FIGS. 3 and 4.

Whereas the invention has been described in conjunction with preferred embodiments, those skilled in the art will perceive improvements, changes and modifications in the invention. Such improvements, changes and modifications within the scope of the art are intended to be covered by the appended claims.

Having described the invention we claim:

1. A digital radio frequency transmitter system comprising:
   an input circuit for receiving digital signals to be amplified and transmitted;
   a digital-to-analog converter for converting the digital signals into analog signals;
   a series circuit including a radio frequency filter and a radio frequency amplifier located downstream from said converter wherein said filter and said amplifier respectively introduce linear and non-linear distortions into the analog signals for transmission by the transmitter;
   a digital pre-correction circuit located upstream from said digital-to-analog converter for pre-correcting said digital signals in a manner to compensate for at least some of said distortions; and,
   an analog pre-correction circuit interposed between said digital-to-analog converter and said series circuit for pre-correcting said analog signals to additionally compensate for at least some of said distortions prior to application to said series circuit.

2. A system as set forth in claim 1 wherein said digital pre-correction circuit includes a digital linear pre-corrector for pre-correcting said digital signals in a manner to compensate for at least some of said linear distortions.

3. A system as set forth in claim 1 wherein said digital pre-correction circuit includes at least one digital non-linear pre-corrector for pre-correcting said digital signals in a manner to compensate for at least some of said non-linear distortions.

4. A system as set forth in claim 1 including at least one digital linear pre-corrector and a digital non-linear pre-corrector.

5. A system as set forth in claim 1 wherein said analog pre-correction circuit includes at least one analog linear pre-corrector.

6. A system as set forth in claim 1 wherein said analog pre-correction circuit includes an analog non-linear pre-corrector.

7. A system as set forth in claim 1 wherein said analog circuit includes at least one analog linear pre-corrector and an analog non-linear pre-corrector.

8. A system as set forth in claim 7 wherein said digital pre-correction circuit includes a digital linear pre-corrector.

9. A system as set forth in claim 7 wherein said digital pre-correction circuit includes a digital non-linear pre-corrector.

10. A system as set forth in claim 7 wherein said digital pre-correction circuit includes at least one digital linear pre-corrector and a digital non-linear pre-corrector.

11. A system as set forth in claim 7 wherein said digital pre-correction circuit includes an adaptive digital linear pre-corrector;
    said series circuit providing an RF output signal;
    a sampler for sampling said RF output signal and providing therefrom an analog sample signal exhibiting distortions corresponding to those of said analog signal; and,
    an analog to digital converter for converting said analog sample signal into a digital correction signal for application to said adaptive digital linear pre-corrector.

12. A system as set forth in claim 11 wherein said filter in said series circuit is upstream from said amplifier.

13. A system as set forth in claim 11 wherein said filter in said series circuit is located downstream from said amplifier.

14. A system as set forth in claim 13 where in said series circuit includes a second radio frequency filter located upstream from said amplifier.

15. A system as set forth in claim 14 wherein said analog linear pre-corrector is located upstream from said analog non-linear pre-corrector.

16. A system as set forth in claim 14 wherein said analog linear pre-corrector is located downstream from said analog non-linear pre-corrector.

17. A system as set forth in claim 16 including a second analog linear pre-corrector located upstream from said analog non-linear pre-corrector.

18. A system as set forth in claim 17 including an adaptive digital non-linear pre-corrector located downstream from said adaptive digital linear pre-corrector.

19. A system as set forth in claim 18 including a second adaptive digital linear pre-corrector located downstream from said adaptive digital non-linear pre-corrector.

* * * * *